US008125568B2

(12) United States Patent
Mori

(10) Patent No.: US 8,125,568 B2
(45) Date of Patent: Feb. 28, 2012

(54) MUTING DEVICE AND MUTING METHOD

(75) Inventor: Tatsumi Mori, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 1358 days.

(21) Appl. No.: 11/784,668

(22) Filed: Apr. 9, 2007

(65) Prior Publication Data

US 2007/0242171 A1    Oct. 18, 2007

(30) Foreign Application Priority Data

Apr. 12, 2006 (JP) .................................. 2006-110107

(51) Int. Cl.
*H04N 3/24* (2006.01)
(52) U.S. Cl. ...................................................... 348/632
(58) Field of Classification Search .................. 348/738, 348/725, 552, 462, 632; 381/94.3, 94, 5, 381/94.1
See application file for complete search history.

(56) References Cited

U.S. PATENT DOCUMENTS

| 4,389,543 | A | | 6/1983 | Granirer et al. | |
|---|---|---|---|---|---|
| 4,912,767 | A | * | 3/1990 | Chang | 704/205 |
| 5,319,736 | A | * | 6/1994 | Hunt | 704/227 |
| 5,369,440 | A | * | 11/1994 | Sussman | 725/28 |
| 5,420,907 | A | * | 5/1995 | Shapiro | 379/38 |
| 5,550,924 | A | * | 8/1996 | Helf et al. | 381/94.3 |
| 5,870,453 | A | | 2/1999 | Shapiro | |
| 6,038,532 | A | * | 3/2000 | Kane et al. | 704/233 |
| 6,476,878 | B1 | * | 11/2002 | Lafay et al. | 348/738 |
| 7,020,292 | B1 | * | 3/2006 | Heubel et al. | 381/94.5 |
| 2004/0027490 | A1 | * | 2/2004 | Bulthuis | 348/632 |

FOREIGN PATENT DOCUMENTS

| JP | H04-373297 A | 12/1992 |
|---|---|---|
| JP | 2002-158942 | 5/2002 |
| WO | WO2004/015860 | 2/2004 |

OTHER PUBLICATIONS

The extended European search report, pursuant to Rule 44a EPC dated Jul. 11, 2007, searched on Jul. 4, 2007.
Japanese Notice of the reason for refusal, dated Apr. 23, 2008.

* cited by examiner

*Primary Examiner* — Paulos Natnael
(74) *Attorney, Agent, or Firm* — Yokoi & Co., U.S.A., Inc.; Toshiyuki Yokoi

(57) ABSTRACT

A muting device includes an external sound input unit that receives an external sound and an internal sound input unit that only receives an internal sound. The external sound received by the external sound input unit has a component, which corresponds to the internal sound received by the internal sound input unit, removed therefrom. Only when the signal level of a specific kind of external sound sampled from the external sound having the internal sound component thereof removed therefrom is equal to or larger than a certain signal level, the internal sound is automatically muted. Consequently, there is provided a muting device that autonomously and accurately mutes an internal audio output responsively to a specific external sound such as a telephone ring while being unaffected by an internal sound.

4 Claims, 4 Drawing Sheets

MUTING DEVICE AND MUTING METHOD

CROSS-REFERENCES TO RELATED APPLICATIONS

The present application is related to the Japanese Patent Application No. 2006-110107, filed Apr. 12, 2006, the entire disclosure of which is expressly incorporated by reference herein.

BACKGROUND OF THE INVENTION (1) Field of the Invention

The present invention relates to a muting device that mutes an internal audio output of electric and electronic equipment, a liquid crystal display television including the muting device, and a muting method.

(2) Description of the Related Art

Televisions that display a broadcasted picture on a display for audiovisual representation have long prevailed in general households as an essential medium to be used to watch entertainment programs, movies, or news. Along with an improvement of the quality of life, televisions equipped with large size screen are gaining popularity. However, CRT-based televisions having been a mainstream in the past have structural drawbacks relevant to a depth, a weight, or power consumption, and have their limitations in increasing the size of a screen.

In recent years, novel display devices different from the cathode-ray tube, such as, a liquid crystal display and a plasma display have been developed due to improvement in an electronic, semiconductor, or material technology. Since the display device is thinner than the conventional cathode-ray tube, it is generically called a flat display panel. The flat display panel designed for televisions has become low-cost and gotten larger in size along with further technological exploitation and profit making of mass-production. Under the favor of an increasing demand derived from a transition to digital television broadcasting and the housing situation in Japan of narrow houses, the flat display panel television is taking over the conventional tube television. The market for the flat display panel is expanding.

Televisions including the flat display panel television naturally provide an audio output when used for audiovisual representation. Depending on the signal level of the audio output, an external sound may be hard to hear.

For example, when a television is used for audiovisual representation, if a telephone call terminates, a trouble may occur. Specifically, a called party may not answer the call because he/she cannot hear a ring. Otherwise, after the called party answers the call, he/she may hardly hear the calling party's voice and may not smoothly proceed with speech. Aside from the trouble with a telephone call, various troubles may occur because of the difficulty in clearly hearing an external sound. Specifically, a person may not hear someone speaking to him/her, smoothly have a talk, or hear a chime generated by an intercom.

Conventionally, the television includes a so-called muting device that can silence an internal sound generated by the television itself or lower the volume responsively to one depression or manipulation in a case where a viewer has to listen to an external sound in order to, for example, make a call. Thus, the internal sound can be readily set to a condition, which causes no trouble in hearing the external sound, by performing a simple manipulation.

However, according to the foregoing method, the viewer himself/herself has to initiate muting at his/her own discretion. When the viewer himself/herself is unaware of a sound, that is, when the viewer cannot hear a ring generated by a telephone and cannot therefore answer a call or cannot hear a chime generated by an intercom, no measures can be taken. Moreover, muting has to be initiated every time it is needed. This annoys the viewer.

As technologies intended to solve the issue of initiating muting in a television, a related art presented below has been disclosed in the past.

In Japanese Unexamined Patent Publication No. 2002-158942, when a telephone call terminates, if a viewer initiates muting in a television, a call termination sound generated by the telephone is automatically registered. Thereafter, whenever a telephone call terminates, muting is automatically initiated.

According to the technology described in Japanese Unexamined Patent Publication No. 2002-158942, the annoyance in initiating muting is resolved. However, after the registration, the call termination sound generated by the telephone is discriminated based on whether a sound registered as a call termination sound to be generated by the telephone is included in sounds collected by a sound collection unit.

The sounds collected by the sound collection unit include an internal sound generated by the television itself. Consequently, for example, if the internal sound includes a component corresponding to the call termination sound generated by the telephone, although the call termination sound is not actually generated by the telephone, termination of a telephone call is recognized. Consequently, muting is automatically initiated.

The foregoing issue is not limited to televisions. The same applies to, for example, stereos, radios, or electric and electronic equipment, which provides an audio output, other then the television.

BRIEF SUMMARY OF THE INVENTION

The present invention provides a muting device capable of autonomously and accurately muting an internal audio output responsively to a specific external sound alone such as a telephone ring without being affected by the internal sound generated thereby, a liquid crystal display television including the muting device, and a muting method.

One aspect of the present invention provides a liquid crystal display television which displays a predetermined picture on a liquid crystal display panel according to an externally received video signal for the purpose of audiovisual representation, and which includes a muting device that mutes an internal sound responsively to an external sound. The muting device includes: an external sound input unit that receives an external sound; an internal sound input unit that only receives an internal sound; an internal sound mask unit that compares the external sound received by the external sound input unit with the internal sound received by the internal sound input unit, and that, if the external sound has a component corresponding to the internal sound, removes the internal sound component from the external sound and transmits the resultant external sound; a band-pass filter circuit that samples only a sound of specific frequencies from the sound sent from the internal sound mask unit and transmits the sampled sound; a frequency designation unit that selects and designates frequencies to be sampled by the band-pass filter circuit; an input level comparison unit that receives the sound sent from the band-pass filter circuit, which decides whether the signal level of the input sound is equal to or larger than a predetermined reference, and that, if the signal level is equal to or larger than the reference, transmits an on-state signal; and an audio control unit that receives the on-state signal from the input level comparison unit, and performs muting by silencing one of the internal audio output and suppressing the internal audio output to a certain signal level. Upon receipt of the external sound sent from the external sound input unit and the internal sound sent from the internal sound input unit, the internal sound mask unit matches the audio signal levels of the external and internal sounds with each other, produces an antiphase sound of the internal sound, superimposes the antiphase internal sound on the external sound in order to lower the audio signal level of the internal sound component, and thus removes the internal sound component from the external sound. The frequency designation unit displays one of a menu and a text list, which includes menu items specifying a telephone ring, a female voice, a male voice, an intercom chime, a fire alarm sound, and a gas leakage alarm sound respectively, on the liquid crystal screen using an on-screen display (OSD) facility, prompts a viewer to select any of the menu items, and thus designates an audio frequency band associated with the selected menu item as a frequency band to be sampled by the band-pass filter circuit. If the audio signal level on a frequency band corresponding to the selected menu item and sampled a sampled sound from the external sound, from which the internal sound component is removed by the internal sound mask unit, the band-pass filter circuit decides whether the sampled sound signal level is equal to or larger than the reference, and if the sampled sound signal level is equal to or larger than the reference, the audio control unit autonomously mutes the internal audio output so as to facilitate hearing of the external sound specified in the selected menu item.

In the liquid crystal display television, an external sound received by the external sound input unit has a component thereof, which corresponds to an internal sound received by the internal sound input unit, removed therefrom. If the sound having the internal sound component thereof removed therefrom includes an audio frequency band associated with a menu item which a viewer is prompted to designate in advance by the frequency designation unit, the audio control unit autonomously mutes the internal audio output so as to facilitate hearing of the external sound specified in the menu item. Consequently, there is provided a liquid crystal display television that accurately and readily facilitates hearing of an external sound, which is specified in a menu item designated in advance by a viewer, while being unaffected by an internal sound generated by the liquid crystal display television itself.

One aspect of the present invention provides a muting device to be included in electric and electronic equipment that provides an audio output, comprising: an external sound input unit that receives a sound from without and makes an external sound; an internal sound input unit that only receives a sound from within and makes an internal sound: and only when a predetermined specific kind of external sound is found in an extracted sound that is acquired by removing the internal sound from the external sound, the internal sound is automatically muted.

In the muting device included in electric and electronic equipment, an external sound received by the external sound input unit has a component thereof, which corresponds to an internal sound received by the internal sound input unit, removed therefrom. If the external sound having the internal sound component thereof removed therefrom includes a specific kind of external sound designated in advance, the internal audio output is automatically muted. Consequently, there is provided a muting device that accurately and readily facilitates hearing of an external sound designated in advance while being unaffected by an internal sound generated by the electric and electronic equipment itself.

An optional aspect of the present invention provides The muting device to be included in electric and electronic equipment, which provides an audio output, according to Claim 2, comprising: the external sound input unit that receives a sound from without and makes an external sound; the internal sound input unit that only receives a sound from within and makes an internal sound; an internal sound mask unit that compares the external sound with the internal sound, and that, if the external sound has a component corresponding to the internal sound, removes the internal sound component from the external sound and transmits the resultant external sound; a band-pass filter circuit that samples only a sound of specific frequencies from the resultant sound and transmits the sampled sound; an input level comparison unit that receives the sampled sound, that decides whether the sampled sound signal level is equal to or larger than a predetermined reference, and that, if the signal level is equal to or larger than the reference, transmits an on-state signal; and an audio control unit that receives the on-state signal from the input level comparison unit and mutes the internal audio output In the muting device included in electric and electronic equipment, an external sound received by the external sound input unit has a component, which corresponds to an input sound received by the internal sound input unit, removed therefrom. If the external sound having the internal sound component removed therefrom includes a sound of specific frequencies, the audio control unit autonomously mutes the internal audio output. Consequently, there is provided a muting device that accurately and readily facilitates hearing of an external sound of specific frequencies while being unaffected by an internal sound generated by the electric and electronic equipment itself.

Another optional aspect of the present invention provides a muting device to be included in electric and electronic equipment that provides an audio output. The muting device includes: an external sound input unit that receives a sound from without and makes an external sound; an internal sound input unit that only receives a sound from within and makes an internal sound; an internal sound mask unit that compares the external sound with the internal sound, and that, if the external sound has a component corresponding to the internal sound, removes the internal sound component from the external sound and transmits the resultant external sound; a band-pass filter circuit that samples only a sound of specific frequencies from the resultant external sound and transmits the sampled sound; a frequency designation unit that selects and designates frequencies to be sampled by the band-pass filter circuit; an input level comparison unit that receives the sampled sound, that decides whether the sampled sound signal level is equal to or larger than a predetermined reference, and that, if the signal level is equal to or larger than the reference, transmits an on-state signal; and an audio control unit that receives the on-state signal from the input level comparison unit, and performs muting by silencing the internal audio output or suppressing the internal audio output to a certain signal level.

In the muting device included in electric and electronic equipment, an external sound received by the external sound input unit has a component, which corresponds to an internal sound received by the internal sound input unit, removed therefrom. If the sound having the internal sound component thereof removed therefrom includes frequencies designated by the frequency designation unit, the audio control unit autonomously mutes the internal audio output. Consequently, there is provided a liquid crystal display television that accurately and readily facilitates hearing of an external sound of frequencies designated in advance while being unaffected by an internal sound.

Another aspect of the present invention provides a muting device to be included in electric and electronic equipment that provides an audio output. The electric and electronic equipment is a liquid crystal display television. The muting device includes: an external sound input unit that receives a sound from without and makes an external sound; an internal sound input unit that only receives a sound from within and makes an internal sound; an internal sound mask unit that compares the external sound with the internal sound, and that, if the external sound has a component corresponding to the internal sound, removes the internal sound component from the external sound and transmits the resultant external sound; a band-pass filter circuit that samples only a sound of specific frequencies from the resultant external sound and transmits the sampled sound; a frequency designation unit that selects and designates frequencies to be sampled by the band-pass filter circuit; an input level comparison unit that receives the sampled sound, that decides whether the signal level of the input sound is equal to or larger than a predetermined reference, and that, if the signal level is equal to or larger than the reference, transmits an on-state signal; and an audio control unit that receives the on-state signal from the input level comparison unit, and performs muting by silencing the internal audio output or suppressing the internal audio output to a certain signal level. On receipt of the external sound sent from the external sound input unit and the internal sound sent from the internal sound input unit, the internal sound mask unit matches the audio signal levels of the external and internal sounds with each other, produces an antiphase sound of the internal sound, superimposes the antiphase internal sound on the external sound so as to lower the signal level of the internal sound component, and thus removes the internal sound component from the external sound. The frequency designation unit displays a menu or a text list, which includes menu items specifying a telephone ring, a female voice, a male voice, an intercom chime, a fire alarm sound, and a gas leakage alarm sound respectively, on the liquid crystal screen using an on-screen display (OSD) facility, prompts a viewer to select any of the menu items, and thus designates an audio frequency band associated with the selected menu item as a frequency band to be sampled by the band-pass filter circuit. If the audio signal level on a frequency band associated with a selected menu and sampled from the external sound, from which the internal sound component is removed by the internal sound mask unit, by the band-pass filter circuit is equal to or larger than the reference, the audio control unit autonomously mutes the internal audio output. Thus, hearing of an external sound specified in the selected menu item is facilitated.

In the liquid crystal display television, an external sound received by the external sound input unit has a component, which corresponds to an internal sound received by the internal sound input unit, removed therefrom. If the external sound having the internal sound component thereof removed therefrom includes an audio frequency band associated with a menu item which a viewer is prompted to designate in advance by the frequency designation unit, the audio control unit autonomously mutes the internal audio output. Thus, hearing of the external sound associated with the menu item is facilitated. Consequently, there is provided a liquid crystal display television that accurately and readily facilitates hearing of an external sound associated with a menu item designated in advance by a viewer while being unaffected by an internal sound generated by the liquid crystal display television itself.

Another aspect of the present invention provides a muting device to be included in electric and electronic equipment that provides an audio output. The muting device facilitates hearing of an external sound associated with a selected menu item according to a sequence described in a flowchart and composed of:
(a) step 1 at which the audio control unit decides whether a menu item associated with a frequency band to be sampled by the band-pass filter circuit has been designated, at which if the menu item has been designated, control is passed to step 2, and at which if the menu item has not been designated, the decision is repeated;
(b) step 2 at which a decision is made on whether electric and electronic equipment has an audio output thereof muted, at which if the audio output is already muted, automatic muting is terminated, and at which if the audio output is not muted, control is passed to step 3;
(c) step 3 at which the internal sound mask unit matches the audio signal level of an internal sound received by the internal sound input unit with the audio signal level of an external sound received by the external sound input unit;
(d) step 4 at which the internal sound mask unit produces an antiphase internal sound that is 180° out of phase with the internal sound whose audio signal level is matched with the audio signal level of the external sound at step 3;
(e) step 5 at which the antiphase internal sound produced at step 4 is superimposed on the external sound handled at step 3 in order to cancel out the internal sound component of the external sound and the antiphase internal sound;
(f) step 6 at which the band-pass filter circuit samples a frequency band, which is associated with the menu item confirmed at step 1, from the external sound having the internal sound component thereof removed therefrom at step 4;
(g) step 7 at which the input level comparison unit decides whether the audio signal level on the frequency band sampled at step 6 is equal to or larger than the reference, at which if the audio signal level is equal to or larger than the reference, control is passed to step 8, and at which if the audio signal level falls below the reference, step 3 is repeated; and
(h) step 8 at which the audio control unit mutes the internal sound and then terminates automatic muting.

Muting is controlled according to the sequence including the above steps, whereby hearing of an external sound of frequencies designated in advance is accurately and readily facilitated without an adverse effect of an internal sound.

Another aspect of the present invention provides a muting device to be included in electric and electronic equipment that provides an audio output. The muting device includes: an external sound input unit that receives an external sound; an internal sound input device that only receives an internal sound; an internal sound mask unit that, when the electric and electronic equipment does not have the audio output thereof muted yet, compares the external sound received by the external sound input unit with the input sound received by the internal sound input unit, and that, if the external sound has a component corresponding to the internal sound, removes the internal sound component from the external sound and transmits the resultant external sound; a band-pass filter circuit that, when the electric and electronic equipment does not have the audio output thereof muted yet, samples only a sound of specific frequencies from the sound sent from the internal sound mask unit and transmits the sampled sound, that, when the electric and electronic equipment has the audio output thereof muted, samples only a sound of specific frequencies from the external sound received directly by the external sound input unit and transmits the sampled sound; a frequency designation unit that selects and designates frequencies to be sampled by the band-pass filter circuit; an input level comparison unit that receives the sound sent from the band-pass filter circuit, that decides whether the signal level of the input sound is equal to or larger than a predetermined reference, and that, if the signal level is equal to or larger than the reference, transmits an on-state signal; and an audio control unit that, when the electric and electronic equipment does not have the audio output thereof muted yet, performs muting by silencing the internal audio output or suppressing the internal audio output to a certain signal level in response to the on-state signal sent from the input level comparison unit, that, when the electric and electronic equipment has the audio output thereof muted, continues muting by silencing the internal audio output or suppressing the internal audio output to a certain signal level in response to the on-state signal sent from the input level comparison unit, and that, when the electric and electronic equipment has the audio output thereof muted, unless the on-state signal is received from the input level comparison unit, restores the internal audio output to a normal condition and terminates muting.

Owing to the foregoing constituent features, when muting has already been performed, if the sampled audio signal level of an external sound is not a certain level, muting is automatically terminated. When muting has already been performed, if continuation of muting is not needed any longer, an internal sound that is muted is automatically restored to a normal audio signal level. Therefore, a viewer can readily restart watching television without any inconvenience.

One aspect of the present invention provides a muting method for muting a generated internal sound responsively to an external sound which is implemented in electric and electronic equipment that provides an audio output, comprising: receiving a sound from without and makes an external sound; receiving a sound from within and makes an internal sound; removing a component corresponding to the internal sound from the external sound; sampling only a sound of specific frequencies from the external sound having the internal sound component, and output a sampled sound; deciding whether the audio signal level of the sampled sound is equal to or larger than a predetermined reference; transmitting an on-state signal if the audio signal level is equal to or larger than the reference; and muting the internal audio output autonomously in response to the on-state signal.

According to the muting method to be implemented in the electric and electronic equipment, a component corresponding to an internal sound received by the internal sound input unit is removed from an external sound received by the external sound input unit. If the sound having the internal sound component thereof removed therefrom includes a sound of specific frequencies, the audio control unit autonomously mutes the internal audio output. Consequently, there is provided a muting method that accurately and readily facilitates hearing of an external sound of specific frequencies while being unaffected by an internal sound generated by the electric and electronic equipment itself.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character(s) present corresponding parts throughout.

DETAILED DESCRIPTION OF THE INVENTION

Figure 1:
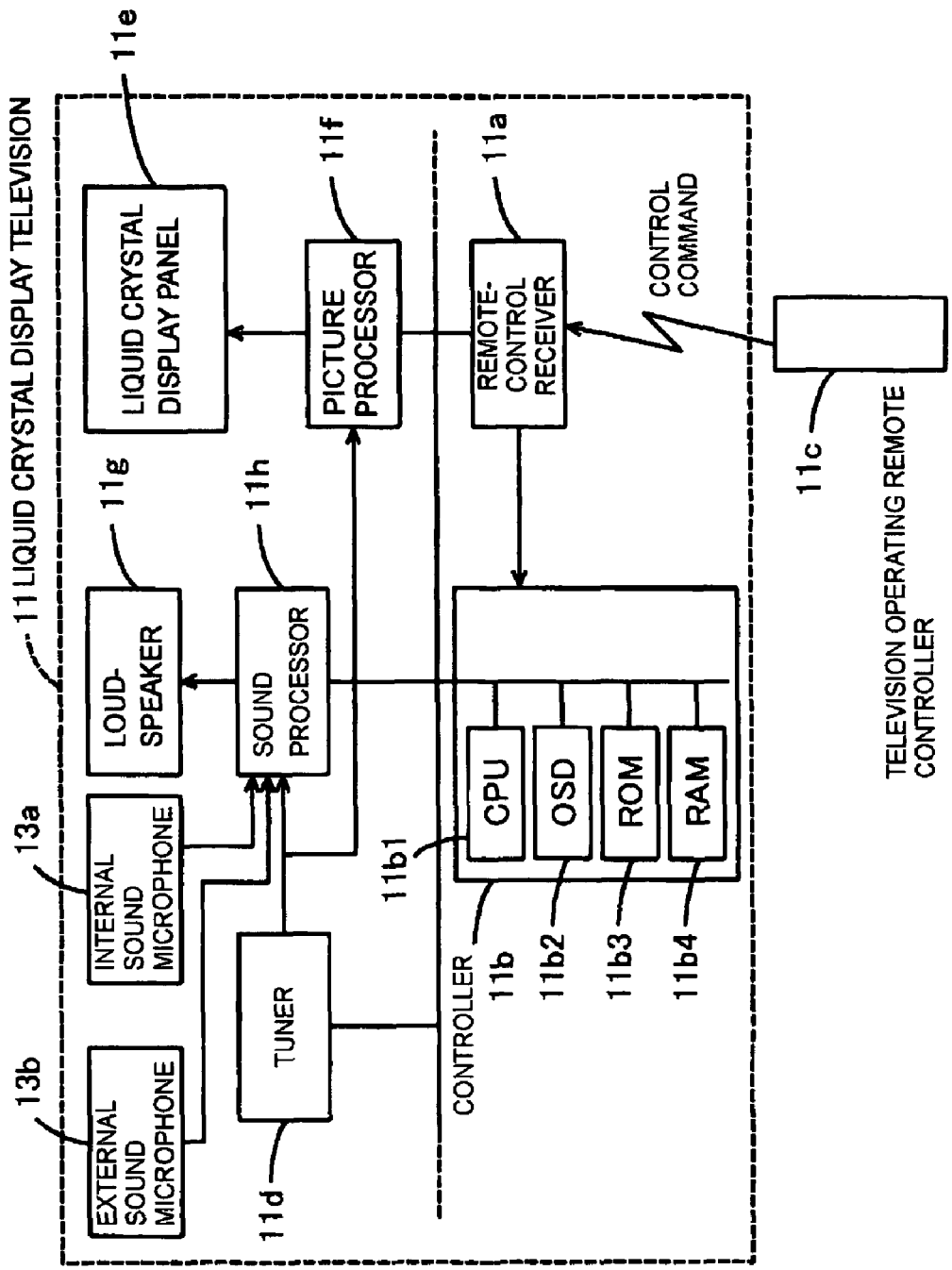
FIG. 1 is a block diagram showing the first embodiment of the present invention.

The first embodiment having the present invention implemented in a liquid crystal display television will be described below. FIG. 1 is a block diagram schematically showing the configuration of a liquid crystal display television 11 of the first embodiment. The description and illustration of structures of the liquid crystal display television 11 having nothing to do with the present invention will be omitted.

In FIG. 1, the liquid crystal display television 11 includes: a controller 11$b$ included in a muting device; a tuner 11$d$ that samples a television signal of a selected channel from a television signal received by an antenna that is not shown; a picture processor 11$f$ that controls or processes a picture represented by the television signal sent from the tuner 11$d$ so that the picture will be displayed in an optimal state on a liquid crystal display panel 11$e$; a sound processor 11$h$ that transmits an internal sound, which is represented by the television signal sent from the tuner 11$d$, via a loudspeaker 11$g$ and that is included in the muting device to be described later; an internal sound microphone 13$a$ that receives an internal sound radiated via the loudspeaker 11$g$, transmits the internal sound to the sound processor 11$h$, and serves as an internal sound input unit included in a muting device 12 to be described later; an external sound microphone 13$b$ that receives an external sound generated around the liquid crystal display television 11, transmits the external sound to the sound processor 11$h$, and serves as an external sound input unit included in the muting device 12 to be described later; and a remote-control receiver 11$a$ that receives a control command sent from a remote controller 11$c$.

The remote controller 11$c$ includes various television operating buttons that are normally used to turn on or off the power supply that is not shown, switch channels, or increase or decrease the volume. The controller 11$b$ internally includes an on-screen display (OSD) facility 11$b$2, a central processing unit (CPU) 11$b$1, a ROM 11$b$3, and a RAM 11$b$4. In response to a control command received by a remote-control receiver 11$a$, the controller 11$b$ controls various television operating facilities such as a facility of turning on or off the power supply, a facility of switching channels, a facility of increasing or decreasing the volume, and a facility of performing muting, and displays a menu or a text list, which includes menu items specifying the operating facilities, on a liquid crystal display screen. Operational power is supplied from a power circuit, which is not shown, to the components of the liquid crystal display television 11. The input of the power circuit is a mains voltage (for example, AC 100 V).

Figure 2:
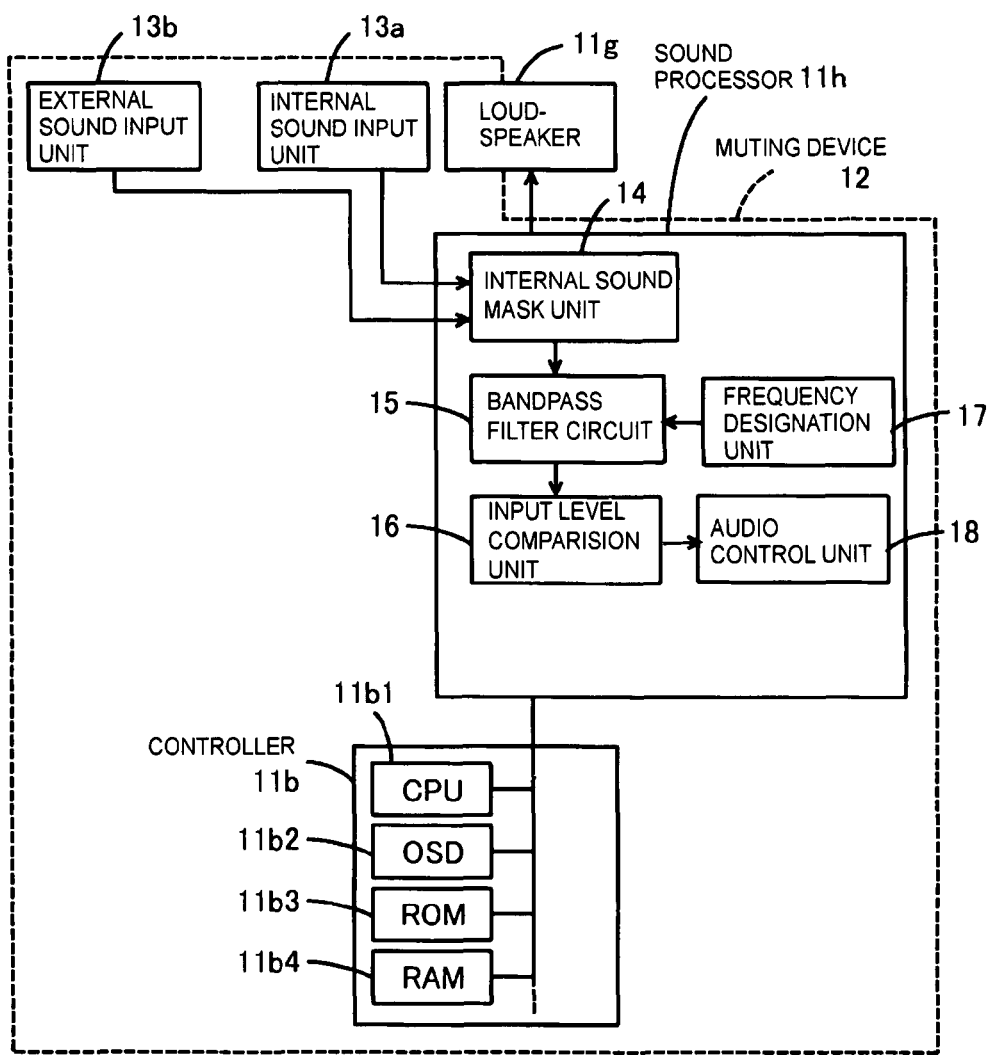
FIG. 2 is a block diagram showing the first embodiment of the present invention.

FIG. 2 is a block diagram schematically showing the configuration of the muting device 12 included in the liquid crystal display television 11. As illustrated, the muting device 12 includes the controller 11*b*, the sound processor 11*h*, an internal sound input unit 13*a*, and an external sound input unit 13*b*.

Specifically, the internal sound input unit 13*a* is disposed near the loudspeaker 11*g*, and collects an internal sound alone generated by the liquid crystal display television itself and radiated via the loudspeaker 11*g*. On the other hand, the external sound input unit 13*b* is disposed in the front upper part of the housing of the liquid crystal display television 11, and collects an external sound generated around the liquid crystal display television 11. Consequently, the external sound may include the internal sound generated by the liquid crystal display television itself.

The sound processor 11*h* includes: an internal sound mask unit 14 that compares the external sound received by the external sound input unit 13*b* with the internal sound received by the internal sound input unit 13*a*, removes an internal sound component from the external sound if any, and transmits the resultant external sound; a band-pass filter circuit 15 that samples only a sound of specific frequencies from the sound sent from the internal sound mask unit 14, and transmits the sampled sound; and an input level comparison unit 16 that receives the sound sent from the band-pass filter circuit 15, that decides whether the signal level of the input sound is equal to or larger than a predetermined reference, and that if the signal level is equal to or larger than the reference, transmits an on-state signal.

The controller 11*b* includes a frequency designation unit 17 that selects and designates frequencies to be sampled by the band-pass filter circuit 15, and a CPU 11*b*1 serving as an audio control unit 18 that receives an on-state signal sent from the input level comparison unit 16 and mutes the internal audio output.

On receipt of the external sound sent from the external sound input unit 13*b* and the internal sound sent from the internal sound input unit 13*a*, the internal sound mask unit 14 matches the audio signal levels of the external and internal sounds with each other, produces an antiphase sound of the internal sound, superimposes the antiphase internal sound on the external sound so as to cancel out the antiphase sound and the internal sound component of the external sound, thus lowers the signal level of the internal sound component, and eventually removes the internal sound component from the external sound.

The CPU 11*b*1 displays a menu or a text list, which includes menu items specifying, for example, a telephone ring, a female voice, a male voice, an intercom chime, a fire alarm sound, and a gas leakage alarm sound respectively, on the liquid crystal screen using the OSD facility 11*b*2. The CPU 11*b*1 prompts a viewer to select a desired menu item or multiple desired menu items from the menu or list using the remote controller, and thus designates an audio frequency band associated with the selected menu item as a frequency band to be sampled by the band-pass filter circuit 15.

If the audio signal level on the frequency band associated with the selected menu item and sampled from the external sound, from which the internal sound component is removed by the internal sound mask unit 14, by the band-pass filter circuit 15 is equal to or larger than the reference, the CPU 11*b*1 autonomously mutes the internal audio output in response to the on-state signal sent from the input level comparison unit 16.

Figure 3:
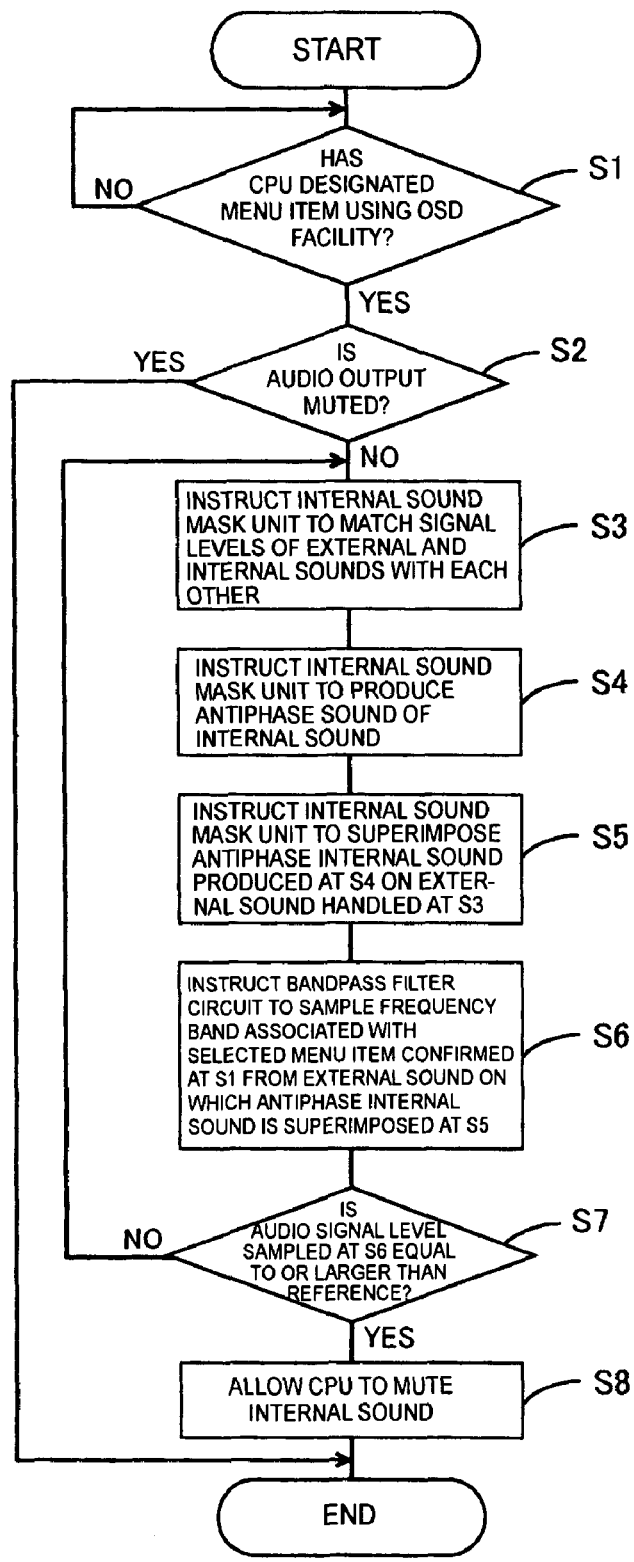
FIG. 3 is a flowchart describing the first embodiment of the present invention.

FIG. 3 is a flowchart describing automatic muting to be performed by the muting device 12.

Referring to FIG. 3, at step 1 (S1), a decision is made on whether the CPU 11*b*1 has designated a menu item associated with a frequency band to be sampled by the band-pass filter circuit 15. If the menu item has been designated, control is passed to step 2 (S2). If the menu item has not been designated, the decision of step 1 (S1) is repeated.

At step 2, a decision is made on whether the liquid crystal display television 11 has the audio output thereof muted. If the audio output has already been muted, automatic muting is terminated. If the audio output has not been muted, control is passed to step 3 (S3).

At step 3 (S3), the internal sound mask unit 14 matches the audio signal level of the internal sound received by the internal sound input unit 13*a* with the audio signal level of the external sound received by the external sound input unit 13*b*, and proceeds to step 4 (S4).

At step 4 (S4), the internal sound mask unit 14 produces an antiphase internal sound that is 180° out of phase with the internal sound whose audio signal level is matched with the audio signal level of the external sound at step 3 (S3), and proceeds to step 5.

At step 5 (S5), the antiphase internal sound produced at step 4 (S4) is superimposed on the external sound handled at step 3 (S3) in order to cancel out the antiphase internal sound and the internal sound component of the external sound. Control is then passed to step 6 (S6).

At step 6 (S6), the band-pass filter circuit 15 samples the frequency band, which is associated with the menu item confirmed at step 1 (S1), from the external sound having the internal sound component thereof removed therefrom at step 5 (S5). Control is then passed to step 7 (S7).

At step 7 (S7), the input level comparison unit 16 decides whether the audio signal level on the frequency band sampled at step 6 (S6) is equal to or larger than the reference. If the audio signal level is equal to or larger than the reference, control is passed to step 8 (S8). If the audio signal level falls below the reference, step 3 (S3) is repeated.

At step 8 (S8), the CPU 11*b*1 mutes the internal sound and then terminates automatic muting.

As mentioned above, the present embodiment includes the external sound input unit 13*b* that receives an external sound and the internal sound input unit 13*a* that receives an internal sound. Whether muting is automatically performed is decided based on the external sound having the internal sound component thereof removed therefrom.

Consequently, there are provided a muting device that accurately and autonomously mutes an internal audio output responsively to a specific external sound such as a telephone ring while being unaffected by an internal sound generated thereby, and that thus facilitates hearing of the specific external sound, and a liquid crystal display television including the muting device.

Next, a description will be made of the constituent features of the second embodiment that not only initiates automatic muting described in relation to the first embodiment but also autonomously restores a muted internal sound after the initiation of automatic muting. A description of the structures shared with the first embodiment will be omitted.

Figure 4:
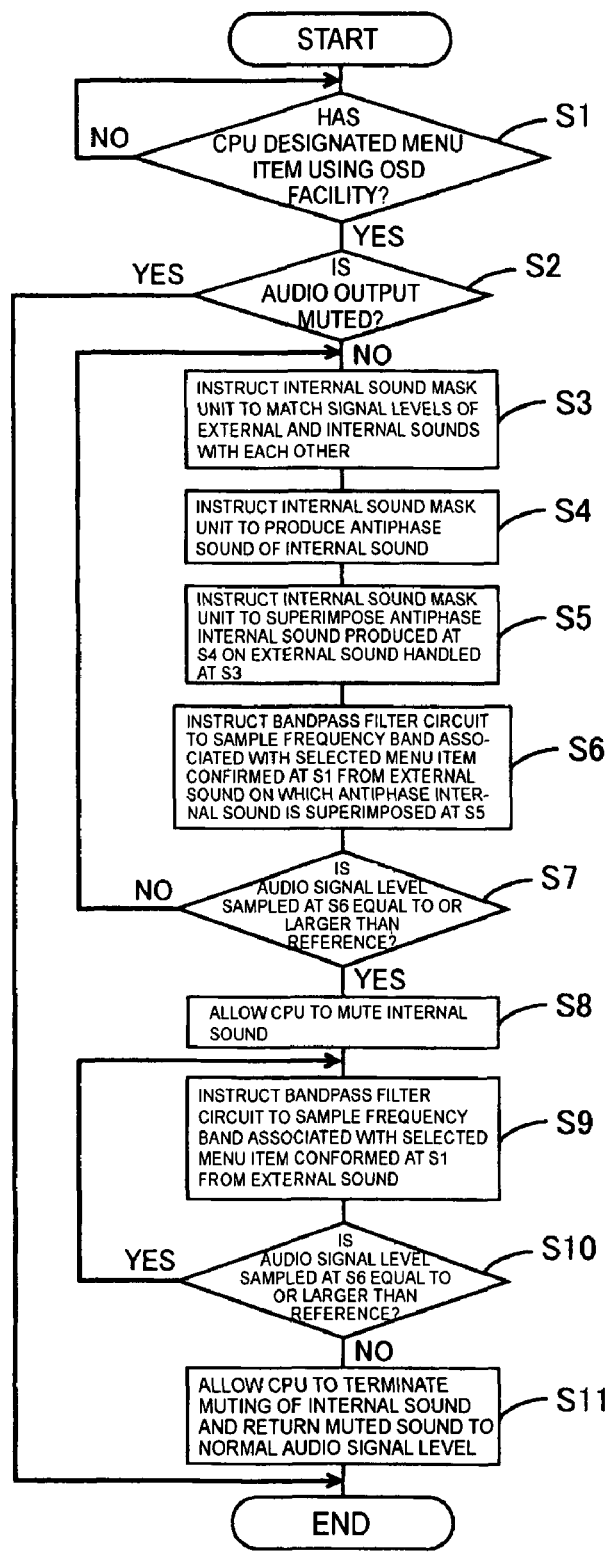
FIG. 4 is a flowchart describing the second embodiment of the present invention.

FIG. 4 is a flowchart describing automatic muting to be performed by a muting device that autonomously restores a muted internal sound. In FIG. 4, steps 1 (S1) to 8 (S8) are identical to those in the first embodiment. The iterative description will be omitted. After the CPU 11*b*1 mutes an internal sound at step 8 (S8), control is passed to step 9 (S9).

At step 9 (S9), the band-pass filter circuit 15 samples a frequency band associated with a menu item from an external sound in the same manner as it does at step 6 (S6). Control is then passed to step 10 (S10). The external sound to be checked herein does not, unlike the one handled at step 6 (S6), have the internal sound component thereof removed therefrom but is the external sound received by the external sound input unit 13b. This is because since an internal sound has already been muted, there is no fear at step 9 that the external sound received by the external sound input unit 13b may include the internal sound (S9).

At step 10 (S10), the input level comparison unit 16 decides whether the audio signal level on the frequency band sampled at step 9 (S9) is equal to or larger than the reference. If the audio signal level falls below the reference, control is passed to step 11 (S11). If the audio signal level is equal to or larger than the reference, step 9 (S9) is repeated.

At step 11 (S11), the CPU 11b1 terminates muting of an internal sound, restores the internal sound to a normal signal-level condition, and terminates automatic muting.

As mentioned above, the present embodiment not only initiates automatic muting similarly to the first embodiment but also autonomously restores a muted sound. Consequently, after the automatic muting is initiated, if speech is completed or continuation of muting is not needed any longer, a muted internal sound is automatically restored to a normal audio signal level. Consequently, a viewer can easily restart watching television without any inconvenience. Moreover, automatic restoration does not require addition of a new member to the first embodiment but requires only addition of control by software. This does not invite any increase in a cost.

The present invention is not limited to the constituent features of the embodiments, but the constituent features can be properly modified as described below.

1. The embodiments have been described by taking for instance a liquid crystal display television as electric and electronic equipment including a muting device. However, the present invention is not limited to the liquid crystal display television but can be applied to various pieces of electric and electronic equipment that provide an audio output, such as, televisions including a plasma television and a CRT television, stereos, and radios.

2. The embodiments have been described to include an internal sound microphone as the internal sound input unit that receives an internal sound. The present invention is not limited to this mode. Alternatively, for example, any microphone may not be employed, and an internal audio signal output to be routed to the loudspeaker may be transferred to the internal sound mask unit as it is.

In this case, since the internal sound microphone is not needed, a cost can be reduced. Moreover, the precision in receiving an internal sound can be improved.

3. The embodiments have been described on the assumption that the frequency designation unit prompts a viewer to select in advance frequencies to be sampled by the band-pass filter circuit, and thus designates the frequencies. The present invention is not limited to this mode. Alternatively, the frequency designation unit may be excluded, and the frequencies to be sampled may be fixed to the frequencies of, for example, a telephone ring or an intercom chime.

In this case, a sound relative to which muting is initiated cannot be designated freely, but a cost can be reduced. Naturally, the advantage of eliminating an internal sound component can still be gotten.

4. The mode in which the frequency designation unit prompts a viewer to select in advance frequencies to be sampled by the band-pass filter circuit and designates the frequencies may be replaced with the mode in which a sound received by the external sound input unit may be used once at the beginning to automatically register a sound to be muted.

5. The embodiments have been described to adopt as a method of removing an internal sound component from an external sound a technique of superimposing an antiphase sound of an internal sound on the external sound so as to cancel out the antiphase sound and the internal sound component of the external sound. The present invention is not limited to the technique. As long as the internal sound component can be removed from the external sound, any technique can be adopted.

6. What is referred to as muting in the embodiments is a concept including not only an idea that an internal sound is fully silenced but also an idea that the audio signal level of the internal sound is suppressed to a certain level. Consequently, when a telephone call terminates, if muting is automatically performed, an internal sound may be fully silenced or deadened to an audio signal level that leaves a viewer untroubled with hearing.

7. After automatic muting is initiated, a decision is, as described in relation to step 9 and step 10 included in the second embodiment, made on whether an external-sound state or a state in which an external sound should be automatically muted persists. Even after a certain time elapses, if the external-sound state in which an external sound should be automatically muted persists, the activation of electric and electronic equipment (liquid crystal display television in the embodiments) itself may be regarded to be unnecessary. The power supply of the electric and electronic equipment may then be turned off. In this case, power can be saved.

8. Needless to say, the constituent features described in relation to the embodiments can be provided not only as a muting device but also as a muting method.

The detailed description set forth below in connection with the appended drawings is intended as a description of presently preferred embodiments of the invention and is not intended to represent the only forms in which the present invention may be constructed and or utilized.

For purposes of illustration, programs and other executable program components are illustrated herein as discrete blocks, although it is recognized that such programs and components may reside at various times in different storage components, and are executed by the data processor(s) of the computers.

What is claimed is:

1. A muting device to be included in electric and electronic equipment that provides an audio output, comprising:

an external sound input unit that receives a sound from without and makes an external sound;

an internal sound input unit that only receives a sound from within and makes an internal sound;

an internal sound mask unit that compares the external sound with the internal sound, and that, if the external sound has a component corresponding to the internal sound, removes the internal sound component from the external sound and transmits the resultant external sound;

a band-pass filter circuit that samples only a sound of specific frequencies from the resultant sound and transmits the sampled sound;

an input level comparison unit that receives the sampled sound, that decides whether the sampled sound signal level is equal to or larger than a predetermined reference, and that, if the signal level is equal to or larger than the reference, transmits an on-state signal; and an audio control unit that receives the on-state signal from the input level comparison unit and mutes the internal sound.

2. The muting device to be included in electric and electronic equipment, which provides an audio output, according to claim 1, comprising:

the external sound input unit that receives a sound from without and makes an external sound;

the internal sound input unit that only receives a sound from within and makes an internal sound;

the internal sound mask unit that compares the external sound with the internal sound, and that, if the external sound has a component corresponding to the internal sound, removes the internal sound component from the external sound and transmits the resultant external sound;

the band-pass filter circuit that samples only a sound of specific frequencies from the resultant external sound and transmits the sampled sound;

a frequency designation unit that selects and designates frequencies to be sampled by the band-pass filter circuit;

the input level comparison unit that receives the sampled sound, that decides whether the sampled sound signal level is equal to or larger than a predetermined reference, and that, if the sampled sound signal level is equal to or larger than the reference, transmits an on-state signal; and the audio control unit that receives the on-state signal from the input level comparison unit, and performs muting by silencing the internal audio output or suppressing the internal audio output to a certain signal level.

3. The muting device to be included in electric and electronic equipment, which provides an audio output, according to claim 2, wherein:

the electric and electronic equipment is a liquid crystal display television;

the muting device includes: the external sound input unit that receives a sound from without and makes an external sound; the internal sound input unit that only receives a sound from within and makes an internal sound; the internal sound mask unit that compares the external sound with the internal sound, and that, if the external sound has a component corresponding to the internal sound, removes the internal sound component from the external sound and transmits the resultant external sound; the band-pass filter circuit that samples only a sound of specific frequencies from the resultant external sound and transmits the sampled sound; the frequency designation unit that selects and designates frequencies to be sampled by the band-pass filter circuit; the input level comparison unit that receives the sampled sound, that decides whether the signal level of the input sound is equal to or larger than a predetermined reference, and that, if the signal level is equal to or larger than the reference, transmits an on-state signal; and the audio control unit that receives the on-state signal from the input level comparison unit, and performs muting by silencing the internal audio output or suppressing the internal audio output to a certain signal level;

on receipt of the external sound sent from the external sound input unit and the internal sound sent from the internal sound input unit, the internal sound mask unit matches the audio signal levels of the external and internal sounds with each other, produces an antiphase sound of the internal sound, superimposes the antiphase internal sound on the external sound so as to lower the signal level of the internal sound component of the external sound, and thus removes the internal sound component from the external sound;

the frequency designation unit displays a menu or a text list, which includes menu items specifying a telephone ring, a female voice, a male voice, an intercom chime, a fire alarm sound, and a gas leakage alarm sound respectively, on a liquid crystal screen using an on-screen display (OSD) facility, prompts a viewer to select any of the menu items, and thus designates the audio frequency band associated with the selected menu item as a frequency band to be sampled by the band-pass filter circuit; and if the audio signal level on the frequency band associated with the selected menu item and sampled from the external sound, from which the internal sound component is removed by the internal sound mask unit, by the band-pass filter circuit is equal to or larger than the reference, the audio control unit autonomously mutes the internal audio output so as to facilitate hearing of the external sound specified in the selected menu item.

4. The muting device to be included in electric and electronic equipment, which provides an audio output, according to claim 1, comprising:

the external sound input unit that receives an external sound;

the internal sound input unit that only receives an internal sound;

the internal sound mask unit that, when the electric and electronic equipment does not have the audio output thereof muted yet, compares the external sound received by the external sound input unit with the internal sound received by the internal sound input unit, and that, if the external sound has a component corresponding to the internal sound, removes the internal sound component from the external sound and transmits the resultant external sound;

the band-pass filter circuit that, when the electric and electronic equipment does not have the audio output thereof muted yet, samples only a sound of specific frequencies from the sound sent from the internal sound mask unit and transmits the sampled sound, and that, when the electric and electronic equipment has the audio output thereof muted, samples only a sound of specific frequencies from the external sound received directly by the external sound input unit and transmits the sampled sound;

a frequency designation unit that selects and designates frequencies to be sampled by the band-pass filter circuit;

the input level comparison unit that receives the sound sent from the band-pass filter circuit, that decides whether the signal level of the input sound is equal to or larger than a predetermined reference, and that, if the signal level is equal to or larger than the reference, transmits an on-state signal; and the audio control unit that, when the electric and electronic equipment does not have the audio output thereof muted yet, performs muting by silencing the internal audio output or suppressing the internal audio output to a certain signal level in response to the on-state signal sent from the input level comparison unit, that, when the electric and electronic equipment has the audio output thereof muted, continues muting by continuously silencing the internal audio output or suppressing the internal audio output to a certain signal level in response to the on-state signal sent from the input level comparison unit, that, when the electric and electronic equipment has the audio output thereof muted, unless the on-state signal is received from the input level comparison unit, restores the internal audio output to a normal condition and terminates muting.

* * * * *